United States Patent [19]

Grodinsky

[11] 4,312,060
[45] Jan. 19, 1982

[54] PREAMPLIFIER FOR PHONOGRAPH PICKUP

[76] Inventor: Robert Grodinsky, 4448 W. Howard St., Skokie, Ill. 60076

[21] Appl. No.: 33,380

[22] Filed: Apr. 26, 1979

[51] Int. Cl.³ .......................... G11B 3/00; G11B 3/74; H03F 3/04
[52] U.S. Cl. ...................................... 369/134; 369/88; 330/302
[58] Field of Search .............. 324/37 R; 179/100.4 A; 330/302, 2; 369/134, 88

[56] References Cited

U.S. PATENT DOCUMENTS 3,718,857 2/1973 Bernard ........................... 324/57 R

OTHER PUBLICATIONS

Electronic World, vol. 73, No. 3, Mar. 1965, p. 76: TK 6540 R623, "Ceramic Cartridge Phon Preamplifier".
Raytheon Technical Information Bulletin, TIS 117-T, May 1959: "Transistorized Preamplifiers", Starko.
Transient Distortion in Transistorized Audio Power Amplifiers, IEEE Transactions on Audio and Electroacoustic, vol. AU-18, No. 3, Sep. 1970, Otala, pp. 234–239.
Suppression of Slew–Rate and Transient Intermodulation Distortions in Audio Power Amplifiers, Journal of the Audio Engineering Society, vol. 25, No. 7/8, Jul.-/Aug. 1977, pp. 466–473, Leach, Jr.
SAE–Schematic for Amplifier Model No. 5534.
Phonograph Preamplifier Design Criteria Arising From System Measurements, by Holeman and Kampmann, Paper Presented to the Audio Engr. Society 1977 Convention.
Journal of Audio Engineering Society, vol. 20, No. 5, Jun. 1972, pp. 396–399.
Handbook of Basic Transistor Circuits and Measurements: Educational Services, Inc., © 1966, pp. 14–15, 34–35.
New Factors in Phonograph Preamplifier Design, Holman: Journal of the Audio Engineering Society, May 1976, vol. 24, No. 4, pp. 263–270.

*Primary Examiner*—Aristotelis M. Psitos

[57] ABSTRACT

The preamplifier has a first stage or section of low or unity gain, such as an emitter-follower circuit, which also isolates the preamplifier from impedance variations of the cartridge, and with a bandwidth for greater than the audio range to reproduce signals with a very high amplitude, rapidly changing wavefront without slew or amplitude overload distortion. A RIAA high frequency de-emphasis network is coupled between this first stage or section and a second amplifier section. A RIAA low frequency emphasis network is preferably placed in a negative feedback circuit of the latter amplifier section where the feedback circuit does not contain the high frequency components filtered out by the high frequency de-emphasis network. The second amplifier section need not have the bandwidth of the first amplifier stage or section.

14 Claims, 7 Drawing Figures

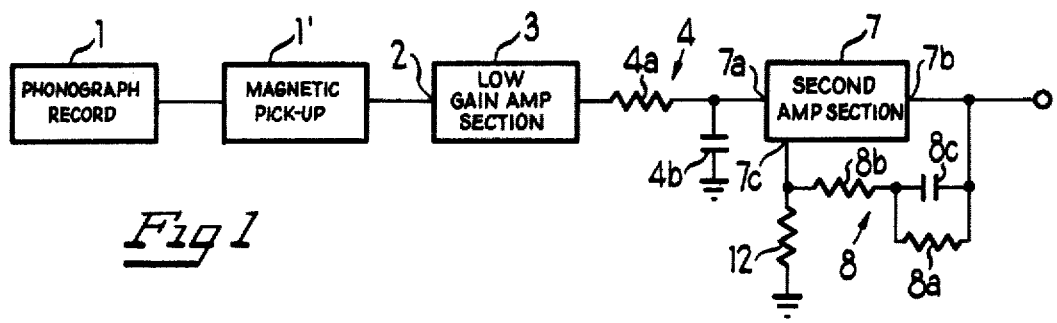
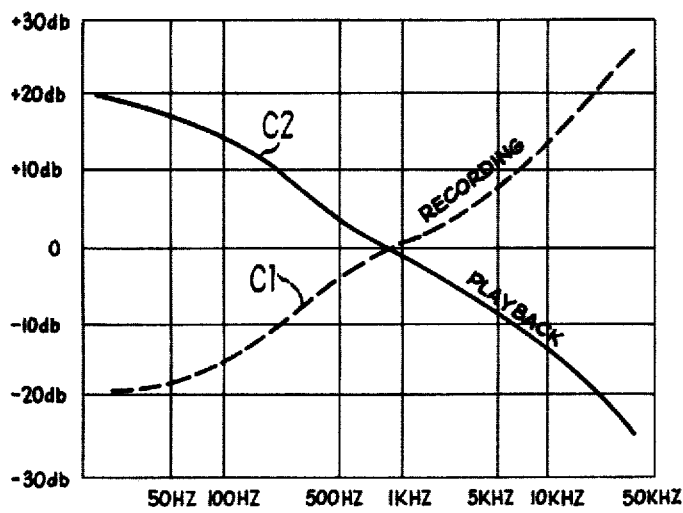
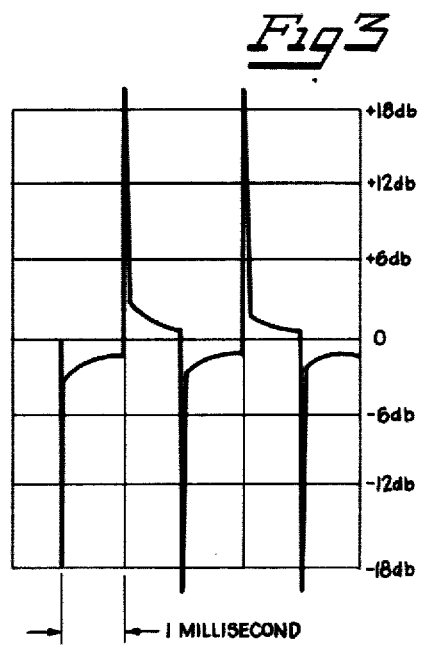
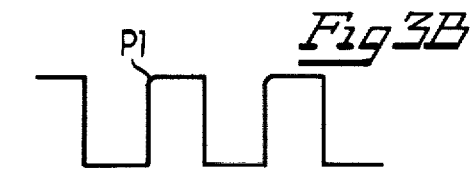
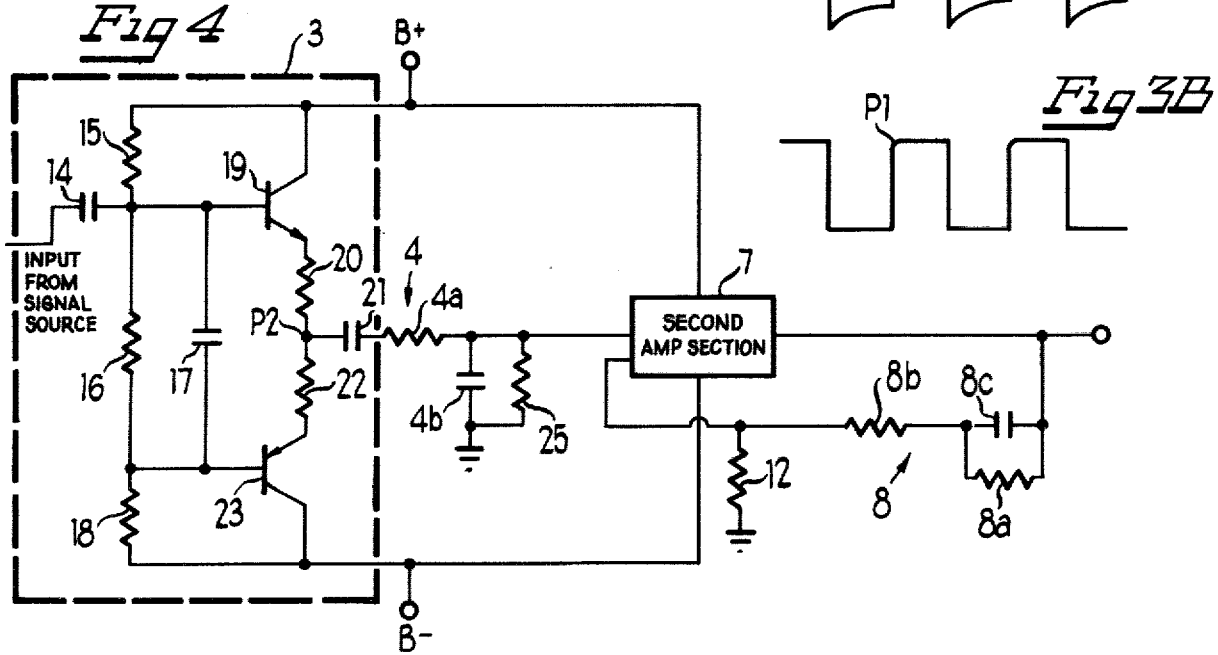

PREAMPLIFIER FOR PHONOGRAPH PICKUP

BACKGROUND OF THE INVENTION

My invention relates to high fidelity phonograph preamplifier circuits used to amplify the outputs of magnetic cartridge phonograph pickups. More specifically, my invention relates to such a unique preamplifier circuit which substantially eliminates distortion present, but not heretofore measured, in high quality preamplifiers because they were tested with inadequate test signals.

My invention substantially minimizes or eliminates amplitude overload distortion, slew overload distortion and a form of distortion only identified in recent years and referred to as transient intermodulation distortion. Slew overload distortion is created when a signal fed to an amplifier stage changes more rapidly than the ability of the same to respond to the rapid change. Amplitude distortion occurs when the signal fed to the stage has an amplitude which drives the amplifier into a saturated state so as to clip the applied signal. Transient intermodulation distortion is generally caused by the inability of a negative feedback amplifier when presented with a fast changing input signal to feedback a needed feedback component in time to interact with the fast input signal. In such cases, the absence of any negative feedback at the inception of such a fast signal causes the first amplifier stage to be driven into distortion or saturation, producing amplitude clipping and/or shock-excited transient distortions in the amplifier.

Distortion in preamplifiers has heretofore generally been measured by feeding a reference sine wave of a relatively modest audio frequency of between 1 KHz and 10 KHz into the preamplifier and measuring any distortion caused thereby. In costly apparent high quality preamplifier systems for which actual low distortion measurements are obtained, it was noticed by listening to recorded music using such preamplifiers that substantial distortion was present which was not detected by the measurements referred to. The reason why the actual distortion was not measured is that the sine wave test signal used was generally inadequate to cause appreciable amounts of the above-identified forms of distortion in even apparently high quality preamplifiers, which actually produce these distortions from musical recordings having high amplitude, rapidly changing signals. I have discovered that the distortion testing signal should ideally resemble that produced at the output of a magnetic cartridge with a fast response time where the recorded signal is that obtained by a square wave of an audio frequency fed to the cutting head used to cut the record through a RIAA pre-emphasis network and with only at most a modest amount of bandwidth limiting, so that the signal from the phono cartridge has a square wave form with a high amplitude spike at the leading edge of each half cycle thereof. This test signal is believed to duplicate the heretofore distortion-producing, rapidly rising signal conditions occurring in many passages of high fidelity recorded music and reproduced by fast response magnetic phonograph pick-ups, but not heretofore measured by the conventional sine wave signal testing techniques. Thus, while the specifications for even the highest quality preamplifiers available today indicate only small levels of distortion are present in such amplifiers, there is in fact a substantial amount of audible distortion produced in these preamplifiers by these fast musical recorded passages.

While in the preprint of a paper presented to the Audio Engineering Society 1977 Convention and entitled "Phonograph Preamplifier Design Criteria Arising from System Measurements", by Holeman & Kampmann, the use of a square wave test signal to measure distortion in preamplifiers is suggested, because of the substantial bandwidth limiting utilized and the fixed modest reference amplitude, the spike square wave test signal did not have a sufficiently high peak to peak amplitude or sufficiently steep wave front to duplicate the effects of distortion producing portions of musical recordings.

To best understand the deficiencies of these prior art preamplifiers, it would be helpful first to review the common forms thereof. First of all, the high amplitude, rapidly rising, distortion-producing portions of musical recordings comprise appreciable Fourier series frequency components far beyond the audio frequency range, such as frequencies of at least about 30 KHz. The first and other stages of conventional apparently high quality preamplifiers have before feedback a bandwidth encompassing an audio frequency range below 2 KHz, the connection of the feedback circuit boosting the bandwith only to about the upper limit of the audio range, and so produce audible slew overload distortion. When negative loop feedback is used in such initial stages of the preamplifier, transient intermodulation distortion is produced when signals having high amplitude, rapidly rising wave fronts are amplified thereby. The RIAA compensation networks of these conventional preamplifiers, which includes a low frequency boost portion and a high frequency de-emphasis or rolloff portion, are commonly placed in a negative feedback loop around two adjacent high gain amplifier stages which generally compose the entire gain producing portion of the preamplifier circuit. Large amounts of negative feedback are required in such a circuit. I have discovered that when these signals are fed through such negative feedback amplifiers the avoidance of transient intermodulation distortion requires exceedingly fast response times and bandwidths like at least about 60 KHz when the feedback circuits are disconnected and preferably as much as 250 KHz which such high gain amplifier stages did not supply. Thus, the gain of the stages used in these negative feedback amplifiers is generally at least about 20–35 db, and the amount of negative feedback is generally above 30 db. This combination of high gain, limited bandwidth and large amounts of feedback at high frequencies, which results from the use of negative feedback to achieve the RIAA playback curve, guarantees substantial amounts of transient intermodulation distortion.

Another less commonly used preamplifier places the RIAA compensating networks totally in the interstage coupling path between the first and subsequent stage of the preamplifier (so that the networks are not in a negative feedback circuit. The difficulty with this design is that the low frequency boost portion of this network has a substantial insertion loss of about 20 db. This causes a noise problem if the gain of the first stage is not sufficient to overcome the 20 db RIAA network loss. This first stage of gain must handle the full system bandwidth and maximum rate of change without slew rate overload, amplitude limiting or transient intermodulation distortion. Such a design is difficult to achieve.

In addition to eliminating from a preamplifier the various forms of distortion described, it is desirable to isolate the preamplifier from impedance variations with frequency of magnetic cartridge phonograph pickups. The usual high gain first preamplifier stage in prior art preamplifiers using negative feedback did not act as a satisfactory isolation to these impedance variations of magnetic cartridge phonograph pickups.

It is an object of my invention to provide a preamplifier which does not interact with magnetic cartridge phonograph cartridge outputs producing high amplitude, rapidly rising wave fronts in a manner to create the various forms of distortion described.

Another object of my invention is to provide a phonograph preamplifier as described which is isolated from the impedance variations of a magnetic cartridge phonograph pickup.

Still another object of my invention is to provide a unique test wave form for evaluating said distortions which have not heretofore been measured by conventional distortion testing methods.

SUMMARY OF THE INVENTION

Perhaps the most important aspect of my invention is the use of a first preamplifier section in advance of any RIAA compensation networks, which section has a fast response and large bandwidth as compared to that found in high gain amplifier stages. Where the first preamplifier section has no negative loop feedback circuit, it should respond without slew overload distortion to steep wave front signals having a rise time no longer than about 5-10 microseconds (which include frequencies greater than about 30 KHz). When the first preamplifier section has an overall loop negative feedback circuit, it should respond without slew overload distortion when the feedback circuit is disconnected to steep wave front signals having a rise time no longer than about 2 to 4 microseconds when the amount of loop feedback is to be no greater than about 20 db. (It is preferred not to use much larger amounts of feedback in the first amplifier section, but if larger amounts of feedback are to be used, then the before feedback response time should be proportionately faster.) A preamplifier stage meets the most common severe requirements if it can pass without distortion my unique spiked square wave test signal having a peak to peak value of preferably no less than, and preferably about, 0.5 volts and a steep wave front with a rise time of no longer than 2 and preferably about 1 microsecond. Also, I have found that an amplifier section cannot presently be designed to respond to signals of such a fast rise time and bandwidth without unacceptable distortion if it has a gain greater than about 20 db. In one form of the invention, the first preamplifier section can be a unity gain emitter-follower circuit which gives very good isolation from impedance variations of a magnetic cartridge pickup. However, it is preferred that this section have a modest overall gain, but no greater than a gain which still avoids transient intermodulation distortion.

Another aspect of the invention is the placement of the high frequency roll-off or de-emphasis portion of the RIAA compensation circuit, which is designed to compensate and therefore eliminate the spiked portion of the recorded square wave (or equivalent musical signal), preferably between the first section or stage of the preamplifier and the next gain stage of the preamplifier. Since this high frequency de-emphasis portion of the RIAA compensation network substantially eliminates all fast changing components from the input of this second generally higher gain amplifier section, no slew overload distortion results.

It is preferable to place the low frequency boost portion of the RIAA compensation network in a feedback circuit around a two stage amplifier which forms a higher gain amplifier section following said first amplifier section and producing an overall gain at 1 KHz in the range of about 35–40 db for the complete preamplifier. The absence of the fast changing signal components in this higher gain amplifier section avoids slew and amplitude overload distortion and the transient intermodulation distortion previously described. Also, this placement of the low frequency boost portion of the RIAA compensation network avoids the insertion loss problem of the last described prior art preamplifier circuit to minimize noise problems which otherwise would require additional first stage gain and thus risk overload.

One preamplifier designer heretofore believed erroneously that he could eliminate transient intermodulation distortion by using a first amplifier section having a loop feedback in excess of 30 db, and followed by a high frequency roll-off RIAA compensating network and an additional amplifier section. Unless otherwise stated, all reference to (net) gain of an amplifier section refers to a gain at 1 KHz. The low frequency boost portion of the RIAA compensation network was placed in the feedback loop of the first amplifier section. With such a large amount of loop negative feedback, the first amplifier section must be so slow acting that there was bound to be a substantial amount of transient intermodulation distortion. The placement of the low frequency boost portion of the RIAA compensation network in the negative feedback loop of the first amplifier section can pose problems by producing a frequency dependent input impedance. Accordingly, I prefer to place this network in a following portion of the preamplifier.

The previously described and other advantages, objects and features of the invention will become apparent upon reference to the specification to follow, the claims and the drawings.

DESCRIPTION OF DRAWINGS

FIG. 1 is a block diagram of the present invention;

FIG. 2 is a graph of the RIAA emphasis frequency characteristic for recording amplifiers and the RIAA de-emphasis frequency characteristic for playback preamplifiers;

FIG. 3 is a graph of the wave form for testing preamplifier distortion;

FIG. 3A is the wave form of FIG. 3 after high frequency de-emphasis;

FIG. 3B shows the ideal square wave form produced in the output of the preamplifier of FIG. 1;

FIG. 4 is a circuit drawing of one form of the invention; and

DESCRIPTION OF EXEMPLARY EMBODIMENT OF THE INVENTION

Figure 5:
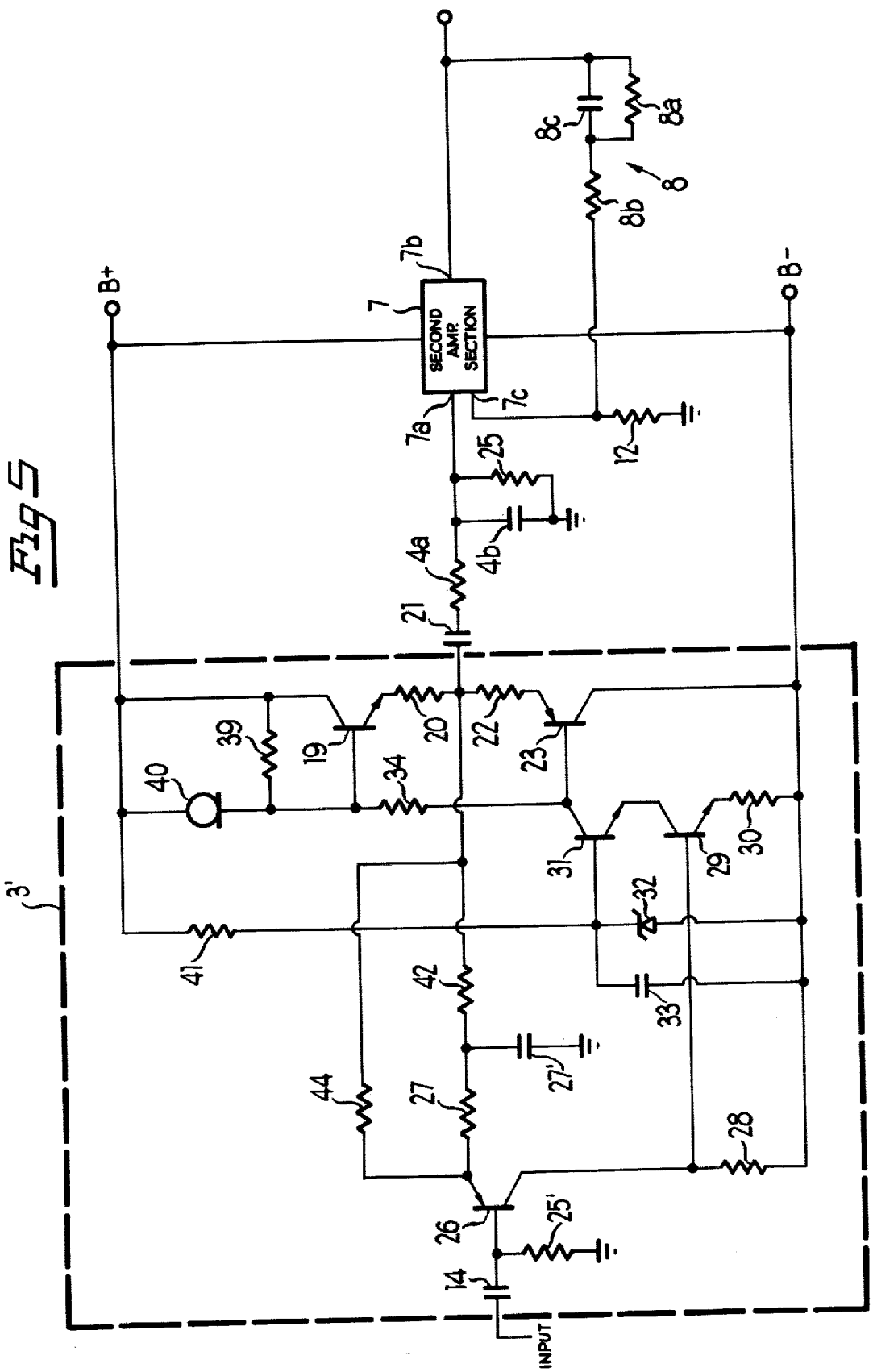
FIG. 5 is a circuit showing the preferred form of the invention.

Referring now to FIG. 1 there is shown one form of the invention comprising a source of RIAA characteristic emphasized audio signals, namely a phonograph record 1 and a magnetic cartridge pickup 1' connected to input terminal 2 of an input section or stage 3 which produces a gain of no greater than about 13–20 db. The input amplifier section 3 has a bandwidth far beyond the upper audio range limit, such as at least about 30–40 KHz. When it includes two stages with a negative feedback loop (referred to in the claims as a multiple stage negative feedback amplifiers) which can readily create transient intermodulation distortion, as previously indicated it should respond without slew overload distortion when the feedback circuit is disconnected to a steep wave front signal having a fast rise time of no longer than about 2 to 4 microseconds when the loop feedback is to be no more than about 20 db. (The preferred amount of feedback is about 5 db.) This requires a bandwidth of from at least 60 KHz and preferably as much as 250 KHz. If it has no such negative feedback circuit, it should respond without slew overload distortion to a steep wave front signal having a rise time of no longer than about 5–10 microseconds, which generally correspond to a bandwidth of at least about 30–60 KHz. Such a wide bandwidth required of the input section 3 of the preamplifier presently limits the gain thereof to no greater than about 13–20 db. (A gain of 13–20 db is advantageous to increase the signal to noise ratio of the preamplifier output since the following amplifier stages can then be designed for lower gain.)

The output of preamplifier input section 3 is connected to a high frequency RIAA de-emphasis network 4 having a time constant preferably of about 75 microseconds and comprising a series resistor 4a and shunt capacitor 4b. This RC network serves two purposes. First of all, it supplies the high frequency rolloff part of the RIAA playback characteristic. Also, by drastically reducing the high frequency energy of the input signal, any subsequent amplifier stages are subjected to a minimum of high frequency overload problems. The output signal of the de-emphasis network 4 with its reduced high frequencies is connected to input terminal 7a of a second amplifier section 7 which preferably comprises two or three relatively high gain stages each contributing gain to produce with the input section 3 an overall gain of about 35–40 db at 1 KHz. This amplifier section 7 has a low frequency RIAA emphasis negative feedback network 8 connected between an output terminal 7b of one of these stages and a feedback input terminal 7c of a preceding stage. The network as illustrated comprises series resistors 8a and 8b and capacitor 8c across resistors 8a. This network reduces the low frequency feedback to supply the low frequency RIAA boost at an overall time constant of about 318 microseconds. Resistor 8a shunts capacitor 8c to stop the low frequency boost and forms with the capacitor a time constant of about 3180 microseconds.

FIG. 2 shows curves C1 and C2 of the complimentary RIAA recording and playback curves respectively which are standardized in the recording industry. The rising high frequency recording characteristic C1 is used to feed the cutterhead which cuts the phonograph record and the playback characteristic C2 is that produced jointly by networks 4 and 8.

FIG. 3 is a graph of the waveform of my preferred test signal generated by passing a 500 hertz square wave through a standard RIAA recording pre-emphasis network band limited by a single section RC network so as to limit the rise time of the resulting signal to about 1 to 2 microseconds. (The test signal utilized by Holeman and Kampman in said article had a much slower rise time so that the test signal did not impose severe enough conditions to test for slew rate and transient intermodulation distortion). Investigation of signals reproducible by phonograph cartridges yields signals having a rise time in a range of from 3 to 20 microseconds for moving coil type cartridges and 10 to 40 microseconds for moving magnet cartridges. The test signal of FIG. 3 is thus a moderately more severe test than the rise times of the signals obtainable from the best recording-cartridge interface. It is thus unexpected to find that a distortion testing signal which gives an accurate test of whether the preamplifier under test will produce audible distortion with typical musical recording signals should be one having faster rise times than the signals measured from such pickups.

The test consists of applying the signal of FIG. 3, starting at very low levels of about 5 millivolts peak to peak. The amplitude of the input signal is raised until a rounding-off in the top of the leading edge of the preamplifier output square wave shown in FIG. 3B at P1 is noticed. Such changes may occur at either the positive or negative going parts of the square wave or both. This indicates the beginning of symmetrical or non-symmetrical distortions. It is often useful to look at the wave forms at the output of the first stage of the preamplifier for the first signs of overload. Extensive listening tests with this test signal have shown that a peak to peak signal capability at the preamplifier input of at least about 0.5 volts is needed to test for complete freedom from audible overload. When the test wave form of FIG. 3 is applied to the input of the preamplifier circuit of FIG. 1, the effect of the high frequency de-emphasis network 4 is to remove the first transient spikes from the wave form of FIG. 3. The resulting wave form is shown in FIG. 3A as a slightly altered-ideal square wave, and is therefore readily amplified by a feedback amplifier section 7 of conventional design.

FIG. 4 shows an exemplary circuit for the first preamplifier section 3. The input signal thereto is fed through a capacitor 14 to the junction of resistors 15 and 16 forming a part of a voltage divider network including also a third resistor 18. This network is connected between B+ and B− DC voltage supply terminals. Resistor 16 sets the bias between the bases of NPN and PNP transistors 19 and 23, respectively. Resistors 15 and 18 determine the input impedance of the preamplifier circuit, and for a standard 47,000 ohm input, each of these resistors should be about 100,000 ohms. The input section 3 is a complementary emitter-follower circuit. This symmetrical type of circuit ensures equal charging and discharging of capacitor 4b of de-emphasis network 4. The output from the emitters of these transistors is taken through emitter resistors 20 and 22 connected to a common point P2, in turn coupled through a capacitor 21 to the de-emphasis network input resistor 4a. Resistors 20 and 22 provide DC feedback stabilization of the operating currents. This current should be set to minimize the noise of this input configuration which, depending on the devices used, is between 10 and 200 micro-amps.

A resistor 25 is coupled across de-emphasis network capacitor 4b to provide a DC reference to ground of the input to amplifier section 7. The rest of the circuit is as shown in FIG. 1.

The amplifier section 7 can be any conventional, integrated or discrete component amplifier, with at least two amplifier stages connected in cascade, with the feedback circuit 8 interconnecting the output of the second stage to the input of a feedback point to the input stage. The requirements for this amplifier section 7 is a preferably overall gain before loop feedback of about 50 db, low input noise and a bandwidth of about 20-50 KHz. The gain of amplifier section after feedback of 1 KHz should be between about 35-40 db.

While the present invention is not limited thereby, the exemplary values for some of the impedance elements in the circuit of FIG. 4 are as follows:

Resistor 4a—10,000 ohms
Capacitor 4b—0.0075 microfarads
Resistor 8a—1.8 megohms
Resistor 8b—100,000 ohms
Capacitor 8c—0.0032 microfarads
Resistor 12—1,500 ohms
Resistor 25—100,000 ohms
Resistor 15—100,000 ohms
Resistor 16—10,000 ohms
Resistor 18—100,000 ohms
Capacitor 14—1 microfarads
Capacitor 17—10 microfarads
Resistor 20—50 ohms
Resistor 22—50 ohms
Capacitor 21—10 microfarads As previously indicated, the noise developed in a preamplifier is minimized if the input section of the preamplifier contributes a significant part of the overall amplification to be achieved. Thus, if the overall amplification of a preamplifier is to be between about 35-40 db, then it would be desirable, for example, if the input section of the preamplifier supply at least about 13-20 db (and preferably at least about 16 db of amplification). In such case, as above indicated, it is generally difficult to obtain the necessary bandwidth and fast response with amplification of this magnitude. Reference should now be made to FIG. 5 where the first preamplifier section 3' includes ahead of an emitter-follower circuit like that shown in FIG. 4 a unique two-stage amplifier circuit with a negative feedback loop which does not create transient intermodulation distortion because, while it supplies substantial gain, it has a very wide before feedback bandwidth and can respond without loop feedback connections to signals with rise times no longer than about 2 to 4 microseconds. Accordingly, the input signal is coupled through capacitor 14 to the base of a PNP transistor 26. Resistor 25' references this base to ground. Emitter resistor 27 and bypass capacitor 27' provide a large amount of local feedback so the stage gain of a transistor 26 is low. The signal across a collector to B− connected resistor 28 is directly coupled to a NPN transistor 29 which together with a NPN transistor 31 form a cascode amplifier. An emitter resistor 30 of transistor 29 is large to keep the gain low (e.g. 5 to 16 db). The purpose of the cascode configuration is to isolate the Miller capacity of the NPN transistor gain stage from the PNP transistor output to maximize the bandwidth thereof. Bias for transistor 31 is set by a Zener diode 32 connected between the base of transistor 31 and the B− bus and a resistor 41 connected between the base of transistor 31 and the B+ bus. A capacitor 33 bypasses the base of transistor 31 so that the drive therefor is from its emitter circuit. The load for the cascode amplifier pair is furnished by a constant current source 40 connected between the B+ bus and a resistor 34, in turn, connected to the collector of transistor 31. This constant current load improves the linearity of the NPN transistor amplifier. A resistor 39 shunts the current source to reduce the gain somewhat to that described. The output signal of the cascode pair is coupled to a NPN-PNP, emitter-follower like that shown in FIG. 4. The emitter-follower transistors 19 and 23 are biased by connections respectively of the base of transistor 19 and the base of transistor 23 across resistor 34. A resistor 44 is connected between the emitter-follower output at the juncture of the emitter resistors 20 to 22 and the emitter of transistor 26, to set overall gain of the entire input section 3' of the preamplifier to between 13-20 db by supplying overall AC and DC loop feedback. Additional DC feedback is obtained through a resistor 42 connected between the emitter-follower circuit output and resistor 27. The emitter-follower circuit output signal is coupled through a capacitor 45 to the high frequency RIAA de-emphasis network 4.

Amplifier 7 in FIGS. 4 and 5 can be a duplicate of the preamplifier section 3' except for different impedance values to increase the gain so that the overall preamplifier gain is a desired 35-40 db at 1 KHz. Also, the feedback circuit 8, in such case, would be returned to the emitter of what is transistor 26 in FIG. 5.

The present invention has produced a truly unique preamplifier which greatly improves the high fidelity quality of sound produced from phonograph records.

It should be understood that numerous modifications may be made in the most preferred forms of the present invention described without deviating from the broader aspects thereof.

I claim:

1. A preamplifier for a magnetic phonograph record pickup, said preamplifier comprising: phonograph pickup signal input terminal means to which the pickup output signals are to be applied; an input section which is devoid of any multiple stage negative feedback amplifiers, said input section having input terminal means coupled to said phonograph pickup input terminal means and output terminal means, said input section having a bandwidth with an upper limit of at least about 30 KHz; a second section, said second section including a multiple stage negative feedback amplifier with a negative feedback circuit around more than one stage thereof, said second section providing amplification of the signals fed to the input thereof and having a bandwidth which accommodates at least audio frequency signals; high frequency roll-off RIAA compensation network means coupled between said output terminal means of said input section of the preamplifier and the input of said second section, whereby said second section receives reduced amounts of said frequency components which fall substantially above 20 KHz; and low frequency boost RIAA compensation network means as part of said negative feedback circuit for boosting relatively low frequencies in the audio frequency range.

2. The preamplifier of claim 1 wherein said input section is an emitter-follower circuit so that the input amplifier section has unity gain, but isolates the input of said second amplifier section from variations of impedance with frequency of said phonograph record pickup.

3. The preamplifier of claim 2 wherein said second amplifier section has an overall gain of about 35-40 db at 1 KHz.

4. The preamplifier of claim 1 or 2 wherein said input section reproduces without slew overload distortion a steep wave front signal having a fast rise time of no longer than about 5-10 microseconds.

5. The preamplifier of claim 1 wherein said input section is capable of reproducing without distortion and in the absence of loop feedback steep wave front signals having a rise time no longer than about 2-4 microseconds.

6. The preamplifier of claim 5 wherein said input section a a gain no greater than about 20 db at 1 KHz.

7. The preamplfier of claim 6 wherein said input section has a gain between about 13-20 db.

8. The preamplifier of claim 7 wherein said second amplifier section has an overall gain of about 25-30 db at 1 KHz.

9. The preamplifier of claim 1 wherein said input section can respond without slew or amplifier overload distortion to a test input signal comprising a square wave signal of an audio frequency with a high amplitude spike at the leading edge of each half cycle thereof.

10. The preamplifier of claim 9 wherein said input section can respond without slew or amplifier overload distortion to a test input signal comprising a square wave signal of an audio frequency with a high amplitude spike at the leading edge of each half cycle thereof, and wherein said test signal has a rise time at least as fast as about 2 microseconds.

11. The preamplifier of claim 1 wherein said input section can respond without slew or amplifier overload distortion to a test input signal comprising a square wave signal of an audio frequency with a high amplitude spike at the leading edge of each half cycle thereof, said test signal having a rise time at least as fast as about 2 microseconds, and wherein said input section can respond to said test signal having a peak to peak value of at least about 0.5 volts.

12. The preamplifier of claim 1, 2, or 5 wherein said second section includes a multiple stage feedback amplifier with a negative feedback circuit between a pair of stages thereof, said low frequency boost RIAA compensating network means being in the latter negative feedback circuit.

13. The preamplifier of claim 1, 5, 6, 7 or 8 having an overall gain in the range of about 35-40 db at 1 KHz.

14. A preamplifier for a magnetic phonograph record pickup, said preamplifier comprising: phonograph pickup signal input terminal means to which audio pickup output signals are to be applied; an input section including a multiple stage negative feedback amplifier with a negative feedback circuit around more than one stage thereof, said input section having input terminal means coupled to said phonograph pickup input terminal means, said input section having a bandwidth which is at least about 60 KHz when said feedback circuit of the multiple stage negative feedback amplifier is disconnected therefrom; a second section providing amplification of the signals fed to the input thereof and having a bandwidth which accommodates at least audio frequency signals; high frequency roll-off RIAA compensation network means coupled between said output terminal means of said input section of the preamplifier and the input of said second section, whereby said second section receives reduced amounts of said frequency components which fall substantially above 20 KHz; and a negative feedback circuit around more than one stage of a multiple stage negative feedback amplifier in one of said preamplifier sections having as a part thereof a low frequency boost RIAA compensation network means for boosting relatively low frequencies in the audio frequency range.

* * * * *